United States Patent
Zheng

(10) Patent No.: US 11,051,394 B1
(45) Date of Patent: Jun. 29, 2021

(54) OPTICAL MODULE AND METHOD OF MANUFACTURING OPTICAL MODULE COMPRISING AN OPTICAL ACTIVE DEVICE DISPOSED IN THE RECESS OF A COMPONENT MOUNTING BLOCK

(71) Applicants: SHUNSIN TECHNOLOGY (ZHONG SHAN) LIMITED, Zhongshan (CN); ShunSin Technology Holdings Limited Taiwan Branch, New Taipei (TW)

(72) Inventor: Han-Biao Zheng, Zhongshan (CN)

(73) Assignee: SHUNSIN TECHNOLOGY (ZHONG SHAN) LIMITED, Zhongshan (CN)

( * ) Notice: Subject to any disclaimer, the term of this patent is extended or adjusted under 35 U.S.C. 154(b) by 0 days.

(21) Appl. No.: 16/855,204

(22) Filed: Apr. 22, 2020

(30) Foreign Application Priority Data

Dec. 31, 2019 (CN) .......................... 201911406265.0

(51) Int. Cl.
| | |
|---|---|
| *G01J 1/44* | (2006.01) |
| *H05K 1/02* | (2006.01) |
| *H05K 1/18* | (2006.01) |
| *H05K 3/30* | (2006.01) |
| *H01S 5/024* | (2006.01) |
| *H01L 31/02* | (2006.01) |
| *H01L 31/0232* | (2014.01) |
| *H01L 31/024* | (2014.01) |

(Continued)

(52) U.S. Cl.
CPC .............. *H05K 1/0203* (2013.01); *G01J 1/44* (2013.01); *H01L 31/0203* (2013.01); *H01L 31/024* (2013.01); *H01L 31/02005* (2013.01); *H01L 31/02019* (2013.01); *H01L 31/02325* (2013.01); *H01S 5/02253* (2021.01); *H01S 5/02325* (2021.01); *H01S 5/02469* (2013.01); *H05K 1/181* (2013.01); *H05K 3/303* (2013.01); *G01J 2001/4466* (2013.01); *H05K 2201/10121* (2013.01)

(58) Field of Classification Search
CPC .. G02B 6/4201; G02B 6/4257; G02B 6/4214; G02B 6/4243; G02B 6/4261; G02B 6/428; H01S 5/023; H01S 5/0233; H01S 5/0235; H01S 5/022; H01S 5/02325; H05K 1/021; H05K 1/02; H05K 1/0274; H05K 3/4697; G01J 1/0271; G01J 1/44
USPC ................................................... 250/239, 551
See application file for complete search history.

(56) References Cited

U.S. PATENT DOCUMENTS 6,299,362 B1 * 10/2001 Gilliland ............ H01R 13/6658
385/92
2017/0097479 A1 4/2017 Oomori et al.

FOREIGN PATENT DOCUMENTS

CN 103984066 A 8/2014
CN 208937754 U 6/2019
(Continued)

*Primary Examiner* — Que Tan Le
(74) *Attorney, Agent, or Firm* — ScienBiziP, P.C.

(57) ABSTRACT

An optical module with enhanced heat-dissipating properties and a method for manufacturing the optical module discloses an optical module which includes a substrate, a printed circuit, a component mounting block, an active device, and a lens. The printed circuit is formed on the substrate. The component mounting block is provided on the substrate, and the component mounting block has a recess. The active device, including a laser or a photodetector, is disposed in the recess. The lens is disposed on the active device.

10 Claims, 5 Drawing Sheets

(51) Int. Cl.
*H01L 31/0203* (2014.01)
*H01S 5/02253* (2021.01)
*H01S 5/02325* (2021.01)

(56) References Cited

FOREIGN PATENT DOCUMENTS

| | | |
|---|---|---|
| TW | I562328 B | 12/2016 |
| TW | I583086 B | 5/2017 |
| TW | 201928424 A | 7/2019 |

* cited by examiner

OPTICAL MODULE AND METHOD OF MANUFACTURING OPTICAL MODULE COMPRISING AN OPTICAL ACTIVE DEVICE DISPOSED IN THE RECESS OF A COMPONENT MOUNTING BLOCK

FIELD

The subject matter herein generally relates to optical modules in an optical transceiver and manufacturing methods of the optical modules.

BACKGROUND

Optical fiber communication has the characteristics of low transmission loss, high data confidentiality, immunity to interference, and large bandwidth. An optical transceiver receives optical signals from optical fiber networks and converts the received optical signals into electrical signals for transmission, or converts electrical signals into optical signals for transmission through the optical fiber networks. An optical module in the optical transceiver has a laser to provide a light source. The laser generates heat during operation. However, the thermal conductivity of conventional circuit boards cannot meet the requirement of heat dissipation caused by heavy use.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
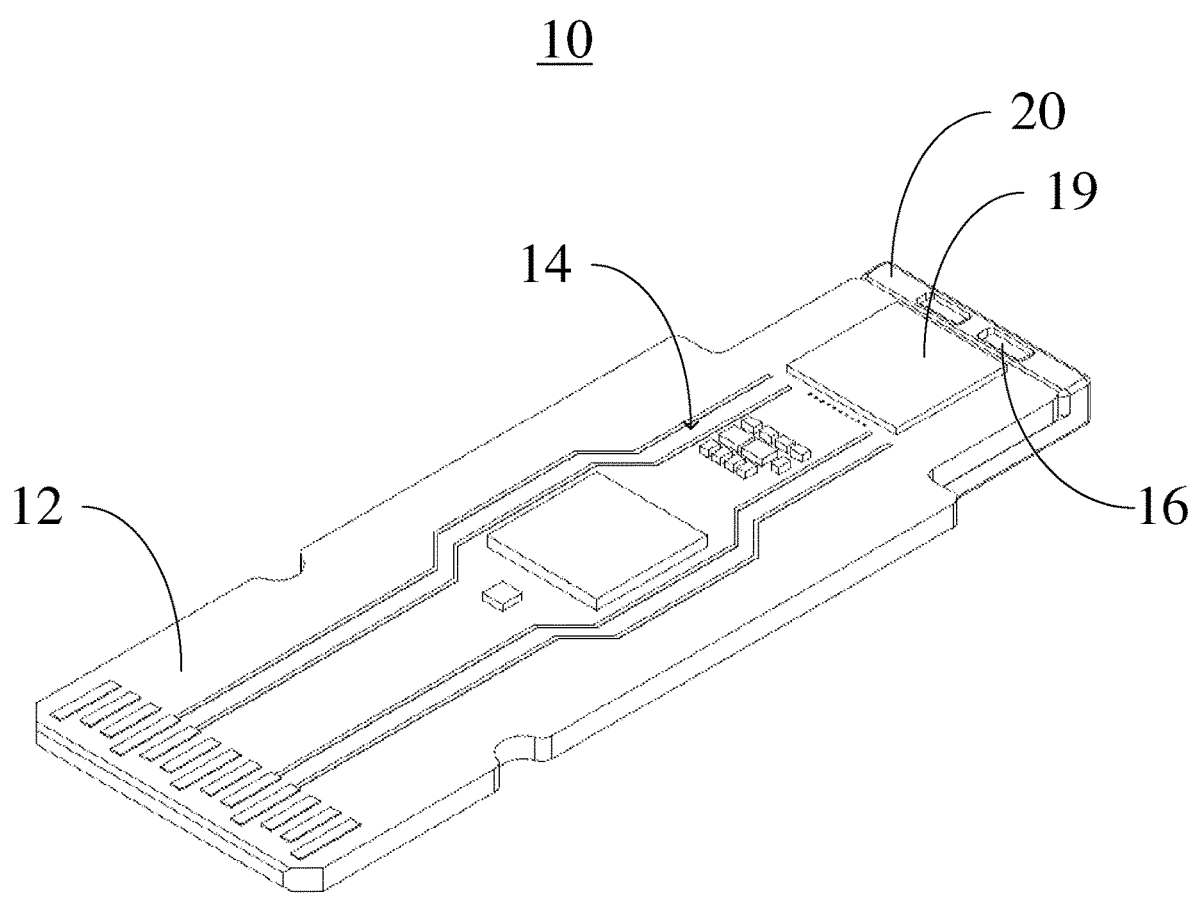
FIG. 1 is a perspective view of an optical module according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one".

The term "coupled" is defined as connected, whether directly or indirectly through intervening components, and is not necessarily limited to physical connections. The connection can be such that the objects are permanently connected or releasably connected. The term "comprising," when utilized, means "comprising, but not necessarily limited to"; it specifically indicates open-ended inclusion or membership in the so-described combination, group, series, and the like.

Figure 2:
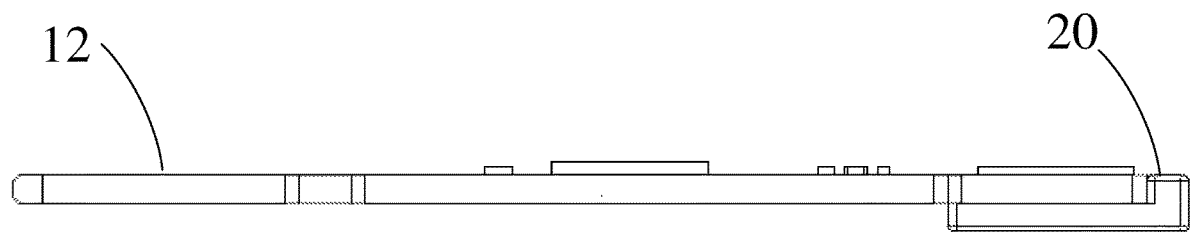
FIG. 2 is a side view of the optical module of FIG. 1.

FIG. 1 shows an optical module 10 according to an embodiment of the present disclosure. FIG. 2 shows a side view of the optical module 10 of FIG. 1. The optical module 10 according to an embodiment of the present disclosure comprises a substrate 12, a printed circuit 14, a component mounting block (CMB) 20, an active device 16, and other circuit elements 19. According to an embodiment of the present disclosure, the circuit elements 19 may include electronic components such as a monitor, a laser controller, or an amplifier. The lens, the thermal conductive pad, and the housing are not shown in FIG. 1 and FIG. 2. According to an embodiment of the present disclosure, the substrate 12 can be formed from various materials, including tantalum, polymer, and ceramic other materials.

The substrate 12 has a pre-formed interconnecting structure, the printed circuit 14 formed by screen printing, and related electronic components. The component mounting block 20 is disposed on the substrate 12. The printed circuit 14 comprises circuit elements necessary for implementing optical signal transmitting and receiving functions, which are well known to those skilled in the art, and will not be repeated here.

Figure 3:
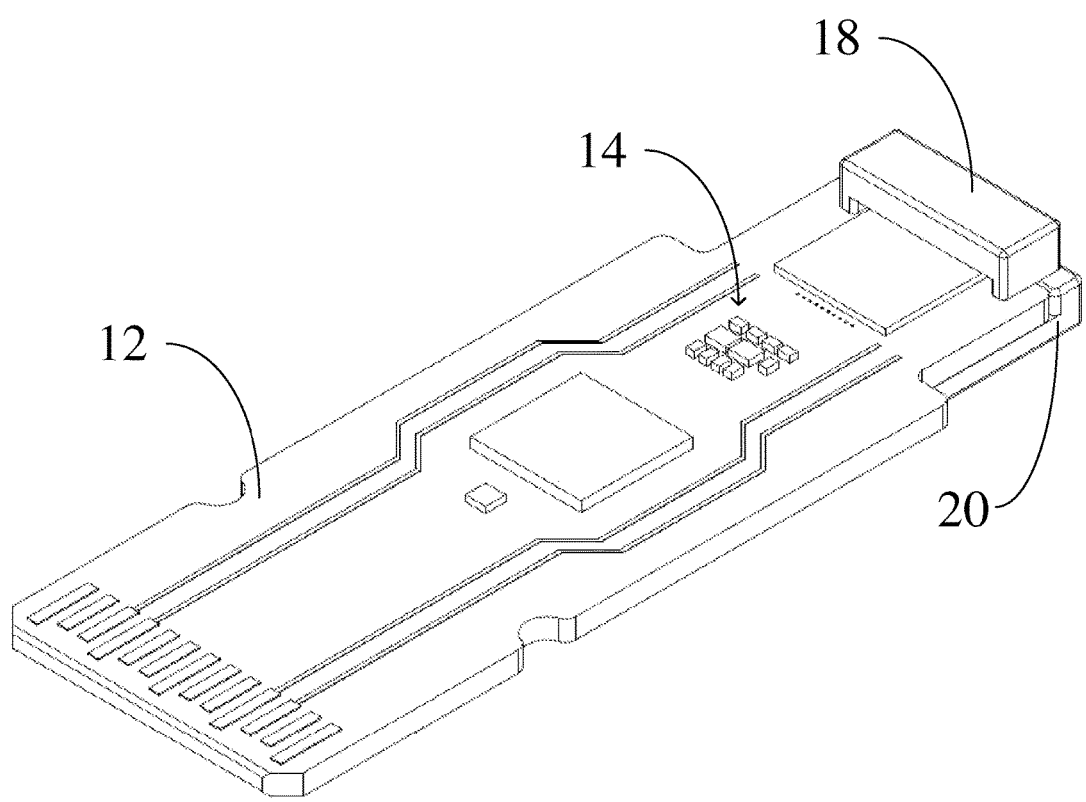
FIG. 3 is a perspective view of an optical module according to another embodiment of the present disclosure.

FIG. 3 shows a perspective view of an optical module according to another embodiment of the present disclosure. In FIG. 3, a lens 18 is added. The lens 18 is disposed on the active device 16 in FIG. 1. According to an embodiment of the present disclosure, the lens 18 is a collecting lens, and the collecting lens concentrates light beams emitted by a laser and forwards the concentrated light beams to an optical fiber, the same then being transmitted to other optical receivers through the optical fiber. In accordance with other embodiments, the lens 18 may also be provided with collimating lenses as needed to adjust the directions of the light beams, such as to render the light beams parallel.

Figure 4:
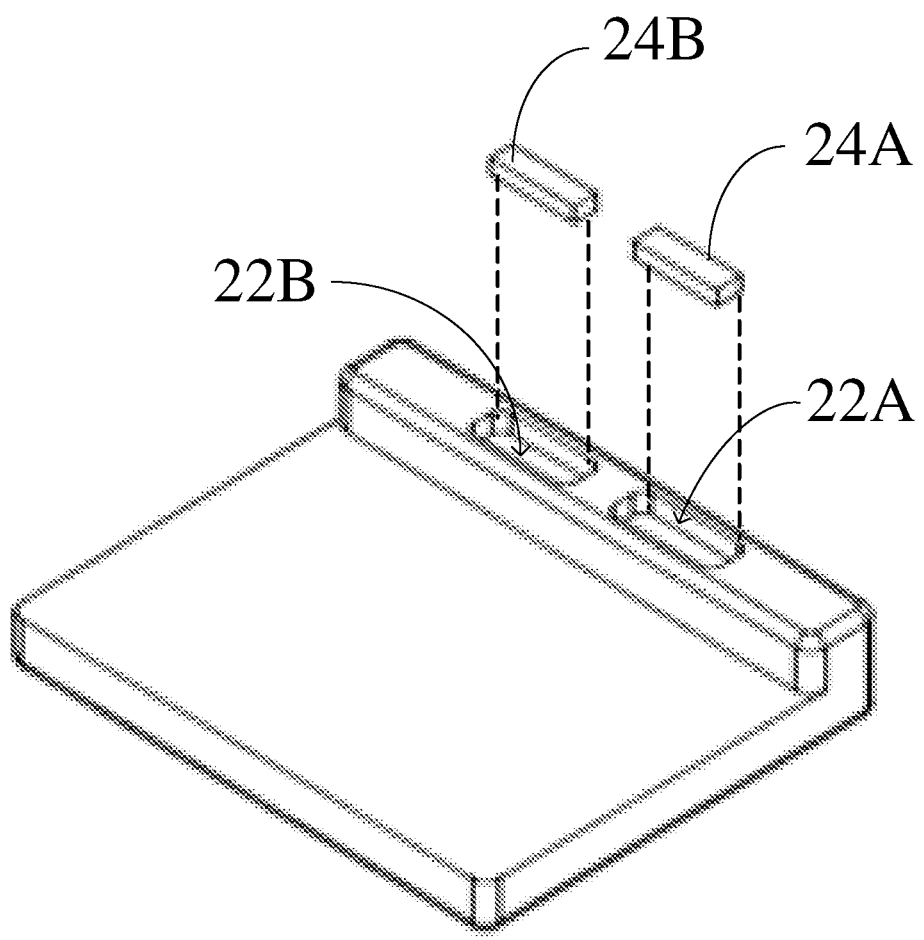
FIG. 4 is an exploded view of a component mounting block according to an embodiment of the present disclosure.

FIG. 4 shows an exploded view of the component mounting block 20 according to an embodiment of the present disclosure. According to an embodiment of the present disclosure, the component mounting block 20 is L-shaped, and may be a metal pad. The component mounting block 20 comprises recesses 22A and 22B. Active devices 24A and 24B are respectively attached to the bottom of the recesses 22A and 22B through glue or an adhesive layer.

According to an embodiment of the present disclosure, the glue or the adhesive layer can be formed from various materials, including a polyimide (PI), polyethylene terephthalate (PET), Teflon, liquid crystal polymer (LCP), polyethylene (PE), polypropylene (PP), polystyrene (PS), polyvinyl Chloride (PVC), nylon or polyamides, polymethyl polymethylmethacrylate (PMMA), acrylonitrile-butadiene-styrene, phenolic pesins, epoxy resin, polyester, silicone, polyurethane (PU), polyamide-imide (PAI), or a combination thereof, not being limited thereto, as long as materials having adhesive properties are applicable to the present disclosure.

As shown in FIG. 4, taking the active device 24A as an example, when the active device 24A is disposed in the recess 22A, the top of the active device 24A may be aligned with the top of the recess 22A. According to the embodiment of the present disclosure, the active device 24A may be a laser, and the active device 24B may be a photodetector.

The active devices 24A and 24B are electrically connected through a screen and a printed circuit (not shown) formed by a printing process. In an embodiment of the present disclosure, the laser can be a single or multiple vertical cavity surface emitting laser diodes (hereinafter referred to as VCSELs). The VCSELs form an array to emit optical signals. In other embodiments, the laser can be surface-emitting laser diodes, light emitting diodes, edge emitting laser diodes (EELD), or distributed feedback lasers (DFB).

In addition, as shown in FIG. 4, the gap between the active device 24A and the recess 22A is filled with a thermal conductive adhesive. Similarly, the gap between the active device 24B and the recess 22B is also filled with the thermal conductive adhesive. According to an embodiment of the present disclosure, the thermal conductive adhesive may be silver glue or solder paste, and the photodetector can be a PIN photodiode or an avalanche photodiode (APD) for converting the light beams coupled by the lens 18 into electrical signals.

After the active devices 24A, 24B, and the lens 18 are mounted on the component mounting block 20, the component mounting block 20 is assembled on the substrate 12. The active devices 24A and 24B on the component mounting block 20 are electrically connected to the printed circuit 14 on the substrate 12 by wire bonding.

Figure 5:
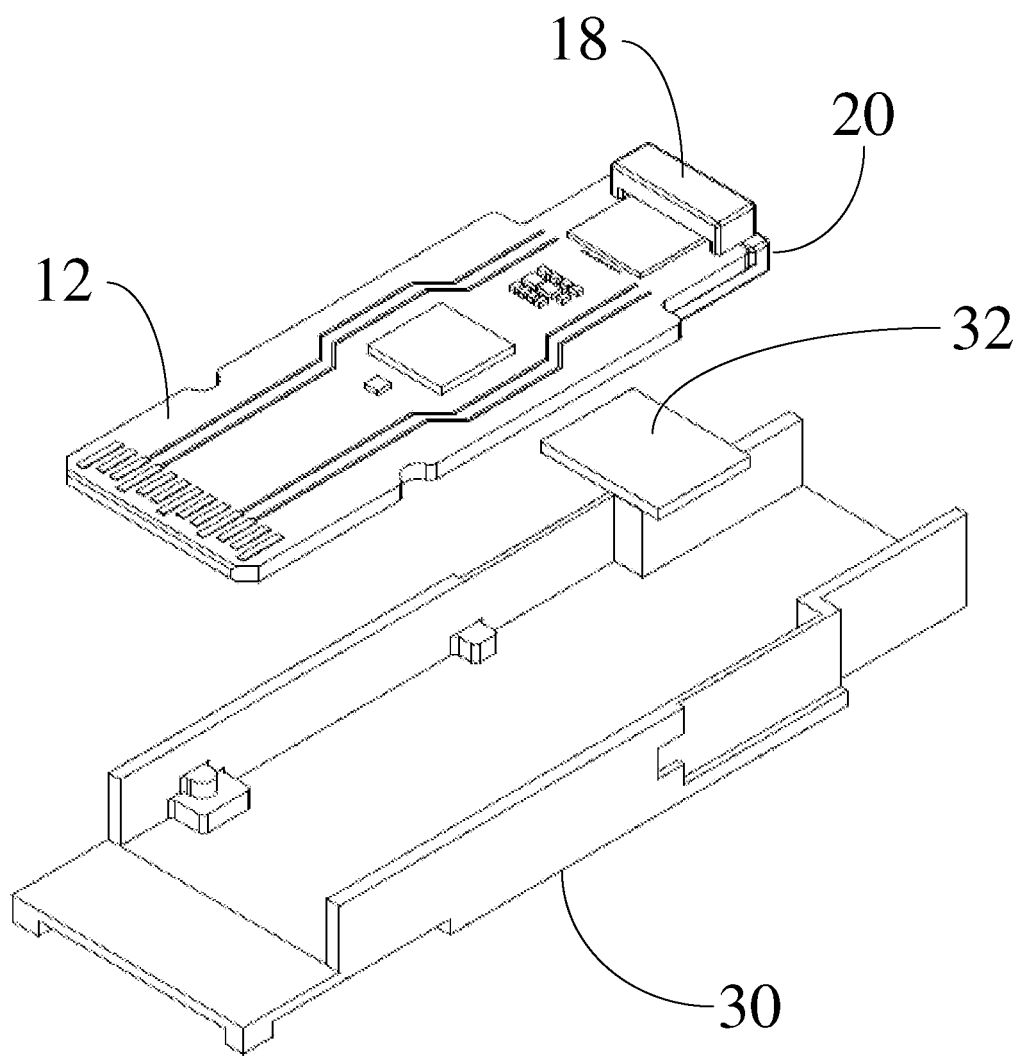
FIG. 5 is an exploded view of the optical module according to another embodiment of the present disclosure.

FIG. 5 shows an exploded view of the optical module 10 according to another embodiment of the present disclosure. According to an embodiment of the present disclosure, the component mounting block 20 is in contact with a housing 30 of the optical module 10 through a thermal conductive pad 32 to conduct heat generated by the active devices 24A and 24B to the housing 30 of the optical module 10, thereby improving heat dissipation.

Figure 6:
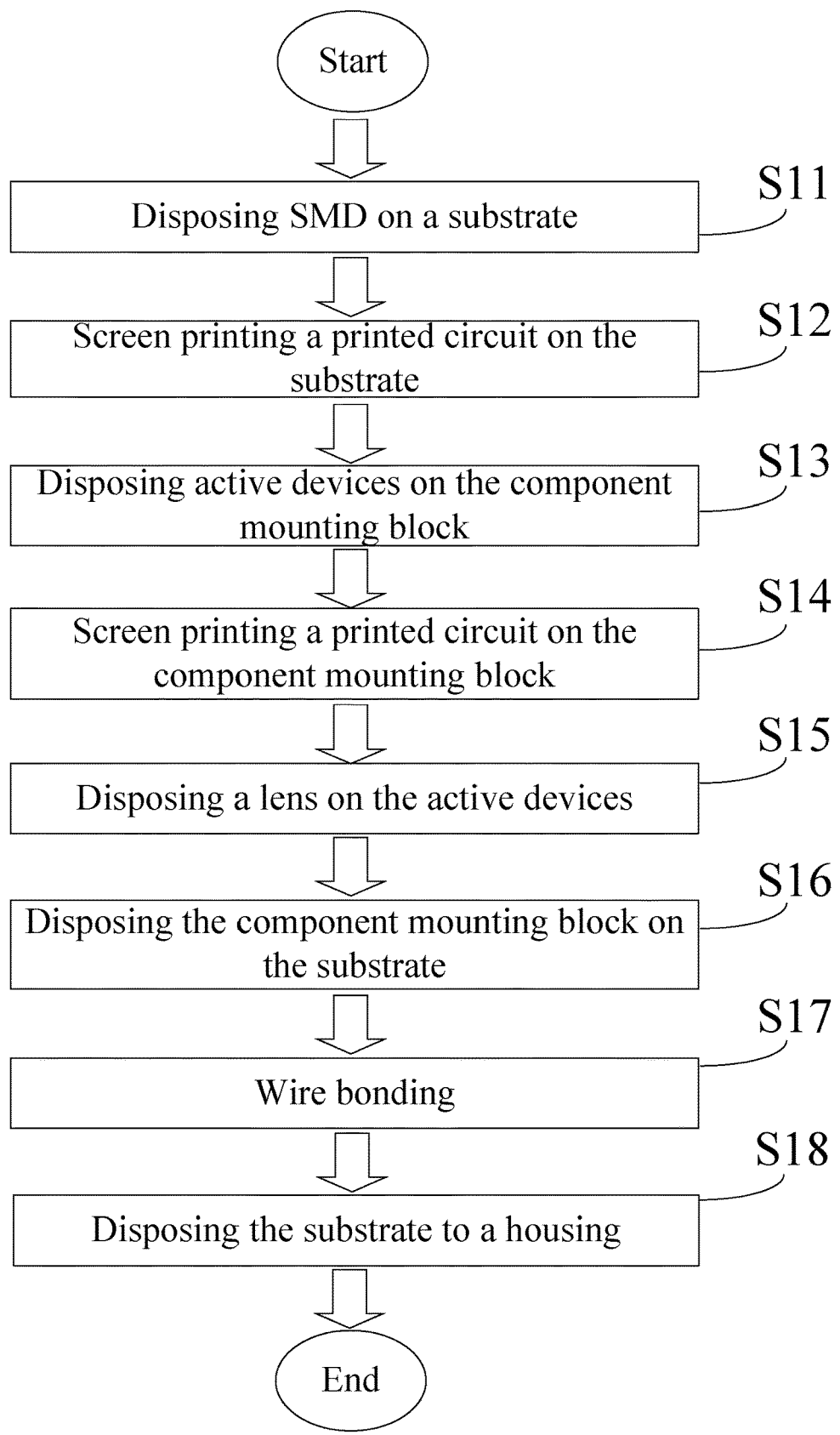
FIG. 6 is a flow chart of a method for manufacturing the optical module according to an embodiment of the present disclosure.

FIG. 6 shows a method for manufacturing the optical module 10 according to an embodiment of the present disclosure. Referring to FIGS. 1-5, firstly, surface-mount devices (SMD) (such as resistors, capacitors, transistors, integrated circuits, etc.) are mounted on the substrate 12 by surface-mount technology (SMT) (block S11). Next, the printed circuit 14 is formed on the substrate 12 by screen printing to be electrically connected to related electronic components (block S12). In other embodiments, the related electronic components can also be mounted on the substrate 12 by through-hole technology. According to an embodiment of the present disclosure, the substrate 12 can be formed from various materials, including a tantalum, a polymer, a ceramic material, and other materials. The substrate 12 comprises the printed circuit 14 and the related electronic components formed by screen printing.

Next, the active devices 24A and 24B are respectively attached to the bottoms of the recesses 22A and 22B of the component mounting block 20 through the glue or the adhesive layer (block S13). According to an embodiment of the present disclosure, the glue or the adhesive layer can be formed from various materials, including a polyimide (PI), polyethylene terephthalate (PET), Teflon, liquid crystal polymer (LCP), polyethylene (PE), polypropylene (PP), polystyrene (PS), polyvinyl Chloride (PVC), nylon or polyamides, polymethyl polymethylmethacrylate (PMMA), acrylonitrile-butadiene-styrene, phenolic pesins, epoxy resin, polyester, silicone, polyurethane (PU), polyamide-imide (PAI), or a combination thereof, not being limited thereto, as long as materials having the required adhesive properties. In block S13, the method further comprises the steps of filling and baking the gap between the active device 24A and the recess 22A, and that between the active device 24B and the recess 22B, with the thermal conductive adhesive.

Next, a printing process is performed to form a printed circuit in the component mounting block 20 (block S14). The printed circuit connects to and between the active devices. Next, the lens 18 is placed on the active devices 24A and 24B (block S15).

In block S15, an optical alignment is performed. First, a positioning element may be disposed on the substrate 12 to assist in preliminary alignment of the active device 24A with the lens 18. An ultraviolet (UV) glue may be applied between the lens 18 and the substrate 12. To improve the positioning accuracy, the position can be aligned by assistance of a charge coupled device (CCD) camera. After the lens 18 is positioned, the UV glue is irradiated with ultraviolet lights to cure the UV glue. With the optical alignment, the lens 18 is coupled to the active device 24A (the laser) and the active device 24B (the photodetector) to form a completed optical path.

Next, the component mounting block 20 assembled with the active devices 24A, 24B and the lens 18 is mounted on the substrate 12 (block S16), and the active devices 24A and 24B on the component mounting block 20 are electrically connected to the printed circuit 14 on the substrate 12 by a wire bonding procedure (block S17). Next, the substrate 12 is mounted to the housing 30 (block S18). The thermal conductive pad 32 is disposed between the component mounting block 20 and the housing 30, and the optical module 10 according to an embodiment of the present disclosure is completed. It should be noted that the order of performing blocks S11-S12 and blocks S13-S15 is not fixed. Those skilled in this art can complete blocks S11-S12 before executing blocks S13-S15, or blocks S13-S15 can be performed before executing blocks S11-S12, and then steps S16-18 are performed to complete the optical module 10 according to an embodiment of the disclosure.

According to the embodiments of the disclosure, a metal pad for mounting electronic components is used, which has better heat conduction efficiency than a conventional ceramic pad. In addition, the metal pad structure comprises a recess to house active devices that generate heat. The gaps between the active devices and the recess are filled with thermally conductive adhesive, improving the efficiency of thermal conduction. Another advantage of using the metal pad in the embodiment of the disclosure is that it can provide shielding against electromagnetic interference of the active device and improve the stability of the operation of the electronic components. In addition, the packaging of the substrate on which the electronic components are mounted and the component mounting block on which the active devices are mounted can be made separate, which effectively improves the efficiency of assembly.

Many relevant details are found in the applicable art, thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and comprising the full extent established by the broad general meaning of the terms used in the claims. It will therefore be appreciated that the embodiments described above may be modified within the scope of the claims.

What is claimed is:

1. An optical module, comprising:
   a substrate;
   a printed circuit formed on the substrate;
   a component mounting block disposed on the substrate, wherein the component mounting block has a recess;
   an active device, comprising a laser or a photodetector, disposed in the recess; and
   a lens disposed on the active device.

2. The optical module as claimed in claim 1, further comprising:
   a housing; and
   a thermal conductive pad provided between the component mounting block and the housing.

3. The optical module as claimed in claim 1, further comprising a monitor and an amplifier, wherein the monitor and the amplifier are disposed on the substrate and coupled through the printed circuit.

4. The optical module as claimed in claim 1, wherein a gap between the active device and the recess is filled with a thermal conductive adhesive.

5. The optical module as claimed in claim 1, wherein the component mounting block is a metal pad.

6. A method for manufacturing an optical module, comprising:
   providing a substrate;
   forming a printed circuit on the substrate;
   providing a component mounting block, wherein the component mounting block has a recess;
   disposing an active device in the recess, wherein the active device comprises a laser or a photodetector;
   disposing a lens on the active device;
   disposing the component mounting block on the substrate; and
   electrically connecting the component mounting block with the active device to the substrate.

7. The method as claimed in claim 6, further comprising:
   providing a housing; and
   disposing a thermal conductive pad between the component mounting block and the housing.

8. The method as claimed in claim 6, further comprising providing a monitor and an amplifier, wherein the monitor and the amplifier are disposed on the substrate and coupled through the printed circuit.

9. The method as claimed in claim 6, further comprising filling a gap between the active device and the recess with a thermal conductive adhesive.

10. The method as claimed in claim 6, wherein the component mounting block is a metal pad.

* * * * *